US012130246B2

(12) United States Patent
Mathijssen et al.

(10) Patent No.: US 12,130,246 B2
(45) Date of Patent: Oct. 29, 2024

(54) METHOD FOR OVERLAY METROLOGY AND APPARATUS THEREOF

(71) Applicant: ASML Netherlands B.V., Veldhoven (NL)

(72) Inventors: Simon Gijsbert Josephus Mathijssen, Rosmalen (NL); Arie Jeffrey Den Boef, Waalre (NL); Kaustuve Bhattacharyya, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 345 days.

(21) Appl. No.: 17/419,653

(22) PCT Filed: Dec. 19, 2019

(86) PCT No.: PCT/EP2019/086222
§ 371 (c)(1),
(2) Date: Jun. 29, 2021

(87) PCT Pub. No.: WO2020/141085
PCT Pub. Date: Jul. 9, 2020

(65) Prior Publication Data
US 2022/0074875 A1    Mar. 10, 2022

Related U.S. Application Data

(60) Provisional application No. 62/787,191, filed on Dec. 31, 2018.

(51) Int. Cl.
*G01N 23/20*    (2018.01)
*G03F 7/00*    (2006.01)
*G06T 5/10*    (2006.01)

(52) U.S. Cl.
CPC ......... *G01N 23/20* (2013.01); *G03F 7/70633* (2013.01); *G06T 5/10* (2013.01); *G06T 2207/30148* (2013.01)

(58) Field of Classification Search
CPC . G01N 23/20; G03F 7/70633; G03F 7/70483; G03F 7/7085; G06T 5/10; G06T 2207/30148
(Continued)

(56) References Cited

U.S. PATENT DOCUMENTS 7,656,529 B1 *  2/2010  Nikoonahad ....... G03F 7/70633
                                                    356/400
8,681,413 B2    3/2014  Manassen et al.
(Continued)

FOREIGN PATENT DOCUMENTS

KR    2017-0085116 A    7/2017
TW      201303258 A     1/2013
(Continued)

OTHER PUBLICATIONS

International Search Report and Written Opinion of the International Searching Authority directed to related International Patent Application No. PCT/EP2019/086222, mailed May 18, 2020; 8 pages.

*Primary Examiner* — Isiaka O Akanbi
(74) *Attorney, Agent, or Firm* — Sterne, Kessler, Goldstein & Fox P.L.L.C.

(57) ABSTRACT

A method includes receiving an image formed in a metrology apparatus wherein the image comprises at least the resulting effect of at least two diffraction orders, and processing the image wherein the processing comprises at least a filtering step, for example a Fourier filter. The process of applying a filter may be obtained also by placing an aperture in the detection branch of the metrology apparatus.

18 Claims, 3 Drawing Sheets

(58) Field of Classification Search
USPC .................. 356/399–401; 382/144–145, 149
See application file for complete search history.

(56) References Cited

U.S. PATENT DOCUMENTS

| | | |
|---|---|---|
| 9,594,311 B2 | 3/2017 | Van De Kerkhof et al. |
| 11,640,116 B2 | 5/2023 | Den Boef et al. |
| 2006/0066855 A1* | 3/2006 | Boef ............... G03F 9/7034 356/401 |
| 2007/0279630 A1 | 12/2007 | Kandel et al. |
| 2008/0032207 A1* | 2/2008 | Graeupner ........ G03F 7/70283 430/5 |
| 2008/0311344 A1* | 12/2008 | Marie Kiers ...... G03F 7/70633 355/53 |
| 2010/0328655 A1 | 12/2010 | Den Boef |
| 2011/0027704 A1 | 2/2011 | Cramer et al. |
| 2011/0043791 A1 | 2/2011 | Smilde et al. |
| 2011/0073775 A1* | 3/2011 | Setija ............... G03F 7/70633 250/492.1 |
| 2011/0102753 A1* | 5/2011 | Van De Kerkhof .. G03F 9/7088 356/326 |
| 2011/0164228 A1* | 7/2011 | Van De Kerkhof ...................... G01N 21/956 355/18 |
| 2011/0229830 A1* | 9/2011 | Bhattacharyya .... G03F 7/70625 356/625 |
| 2012/0123581 A1 | 5/2012 | Smilde et al. |
| 2012/0242940 A1 | 9/2012 | Nagata et al. |
| 2013/0258310 A1* | 10/2013 | Smilde ............ G03F 7/70633 356/237.1 |
| 2016/0011523 A1* | 1/2016 | Singh ............ G01N 21/4788 355/77 |
| 2016/0161864 A1 | 6/2016 | Middlebrooks et al. |
| 2017/0146915 A1* | 5/2017 | Levinski ............ H04N 23/673 |
| 2017/0293233 A1* | 10/2017 | Van Der Schaar ...................... G03F 7/70633 |
| 2018/0129139 A1* | 5/2018 | Jiang ............ G03F 7/70683 |

FOREIGN PATENT DOCUMENTS

| | | |
|---|---|---|
| TW | 201443581 A | 11/2014 |
| WO | WO 2009/078708 A1 | 6/2009 |
| WO | WO 2009/106279 A1 | 9/2009 |
| WO | WO 2016/005167 A1 | 1/2016 |

* cited by examiner

METHOD FOR OVERLAY METROLOGY AND APPARATUS THEREOF

CROSS-REFERENCE TO RELATED APPLICATIONS

This application claims priority of U.S. application 62/787,191 which was filed on Dec. 31, 2018 and which is incorporated herein in its entirety by reference.

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned Significant aspects to enabling a patterning process (i.e., a process of creating a device or other structure involving patterning (such as lithographic exposure or imprint), which may typically include one or more associated processing steps such as development of resist, etching, etc.) include developing the process itself, setting it up for monitoring and control and then actually monitoring and controlling the process itself. Assuming a configuration of the fundamentals of the patterning process, such as the patterning device pattern(s), the resist type(s), post-lithography process steps (such as the development, etch, etc.), it is desirable to setup an apparatus in the patterning process for transferring the pattern onto the substrates, develop one or more metrology targets to monitor the process, setup up a metrology process to measure the metrology targets and then implement a process of monitoring and/or controlling the process based on measurements.

So, in a patterning process, it is desirable to determine (e.g., measure, simulate using one or more models that model one or more aspects of the patterning process, etc.) one or more parameters of interest, such as the critical dimension (CD) of a structure, the overlay error between successive layers (i.e., the undesired and unintentional misalignment of successive layers) formed in or on the substrate, etc.

BRIEF DESCRIPTION OF THE DRAWINGS/FIGURES

The accompanying drawings, which are incorporated herein and form part of the specification, illustrate the present disclosure and, together with the description, further serve to explain the principles of the present disclosure and to enable those skilled in the relevant art(s) to make and use aspects described herein.

DETAILED DESCRIPTION OF THE INVENTION

Figure 1:
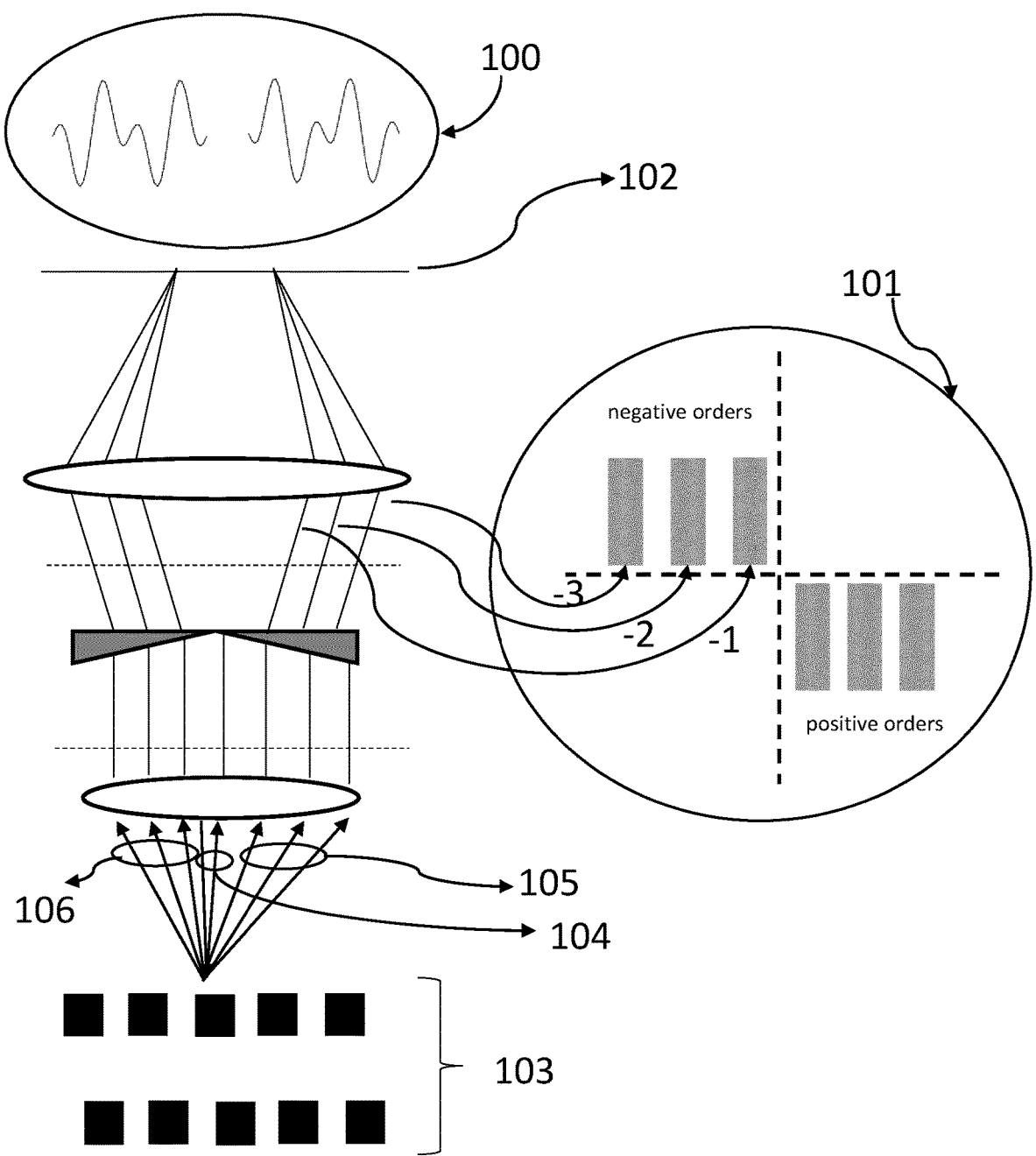
FIG. 1 depicts a dark field scatterometer according to aspects of the disclosure.

It is desirable to determine such one or more parameters of interest for structures created by a patterning process and use them for design, control and/or monitoring relating to the patterning process, e.g., for process design, control and/or verification. The determined one or more parameters of interest of patterned structures can be used for patterning process design, correction and/or verification, defect detection or classification, yield estimation and/or process control.

Thus, in patterning processes, it is desirable frequently to make measurements of the structures created, e.g., for process control and verification. Various tools for making such measurements are known, including scanning electron microscopes, which are often used to measure critical dimension (CD), and specialized tools to measure overlay, a measure of the accuracy of alignment of two layers in a device. Overlay may be described in terms of the degree of misalignment between the two layers, for example reference to a measured overlay of 1 nm may describe a situation where two layers are misaligned by 1 nm.

Various forms of inspection apparatus (e.g., metrology apparatus) have been developed for use in the lithographic field. For example, scatterometry devices direct a beam of radiation onto a target and measure one or more properties of the redirected (e.g., scattered) radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target by iterative approaches such as rigorous coupled wave analysis or finite element methods; library searches; and principal component analysis.

A further technique involves having the zeroth order of diffraction (corresponding to a specular reflection) blocked, and only higher orders are processed. Examples of such metrology can be found in PCT patent application publication nos. WO 2009/078708 and WO 2009/106279, which are hereby incorporated by reference in their entirety. Further developments of the technique have been described in U.S. patent application publication nos. US 2011-0027704, US 2011-0043791 and US 2012-0242940, each of which is incorporated herein in its entirety. Such diffraction-based techniques are typically used to measure overlay. The targets for techniques can be smaller than the illumination spot and may be surrounded by product structures on a substrate. A target can comprise multiple periodic structures, which can be measured in one image. In a particular form of such a metrology technique, overlay measurement results are obtained by measuring a target twice under certain conditions, while either rotating the target or changing the illumination mode or imaging mode to obtain separately the $-1^{st}$ and the $+1^{st}$ diffraction order intensities. The intensity asymmetry, a comparison of these diffraction order intensities, for a given target provides a measurement of target asymmetry, that is asymmetry in the target. This asymmetry in the target can be used as an indicator of overlay error.

So, as described, during the manufacturing process there is a need to inspect the manufactured structures and/or to measure one or more characteristics of the manufactured structures. Suitable inspection and metrology apparatuses are known in the art. One of the known metrology apparatuses is a scatterometer and, for example, a dark field scatterometer. U.S. patent application publication US 2016/0161864, U.S. patent application publication US 2010/0328655 and U.S. patent application publication US 2006/0066855 discuss embodiments of a photolithographic apparatus and embodiments of a scatterometer. The cited documents are herein incorporated by reference in their entirety.

Electronic devices, such as integrated circuits, are often manufactured by means of a manufacturing process in which layers are formed on top of each other on a substrate by means of several process steps. One of the process steps may be photolithography which may use electromagnetic radiation in the deep ultraviolet (DUV) spectral range or in the extreme ultraviolet (EUV) spectral range. The substrate is often a silicon wafer. The smallest dimensions of the manufactured structures are in the nanometer range.

FIG. 1 depicts a schematic of an dark field scatterometer as mentioned above, and the images formed in case the imaging sensor is placed in the image plane, or in the pupil plane of the scatterometer. The image formed in the image plane is depicted in element 100, wherein the image plane is element 102. The image formed in the pupil plane is depicted in element 101. Element 103 is an overlapping grating wherein a relative shift between the top and bottom grating is formed, i.e. there is an overlay present between the two layers. Element 104 depicts the radiation impinging on the grating and the resulting $0^{th}$ order or specular scattered radiation. In a dark field scatterometer this radiation is blocked by the design of the apparatus, for example by using apertures in the illumination branch, as described in previously cited prior art. Elements 105 and 106 depict the diffraction orders resulting from the scattering of the impinging branch of the 104 radiation on the target 103. 105 depicts the negative orders and 106 depicts the positive orders.

In a diffraction based metrology method and apparatus, there is a relationship between the wavelength of light, the pitch of the grating on the wafer and the NA (numerical aperture) of the optical system, in this case the metrology tool or scatterometer. If the ratio between the wavelength and the pitch is smaller than the NA of the optical system, NA multiplied by a constant, the image does not resolve the structures on the target. If, however, said ratio is larger than the NA multiplied by a constant (most cases the constant is 1), the measured image resolves the structures present on the wafer, the structures become visible. In a typical mode of operation, a dark field scatterometer does not resolve the structures/targets on the wafer, and the metrology method relies on measuring the average intensity of the obtained image. Such method is well described in the art and in the previously cited patent application. In such typical mode of operations, the pitch of the structure is comparable with the wavelength of the light.

A problem arises as the pitch of the underling target, such as element 103 in FIG. 1, becomes much larger that the wavelength of the imping radiation. In this case, as depicted in element 100, multiple diffraction orders are available in the pupil plane, and all contribute to the image formation in the image plane, as depicted in element 100 of FIG. 1. Such large pitch targets, large as defined with respect to the wavelength of the light used in the metrology apparatus, occur, for example, in metrology of 3D-NAND structures, wherein, due to limitation imposed by the specific processing conditions, the pitches of the metrology targets are in micron ranges, wherein the wavelength of the light remains in the optical regime. Such abundance of diffraction orders leads to complex interference patterns, as depicted in element 100, complex interference patterns which are difficult to eliminate as one use state of the art overlay extraction methods, methods which rely on smooth images, as obtained when the wavelength and the pitch of the gratings are comparable.

It is an object of the current invention to provide a method which allows using state of the art overlay measurements in a regime wherein the wavelength of the radiation is smaller than the pitch of the metrology target. The method comprises obtaining an image in the image plane of the metrology detection branch, for example when the imaging sensor is placed in said image plane, and filtering the image of the contributions due to complex interference patterns of multiple non-zero diffraction orders. In an embodiment, the filter is a digital filter. In an embodiment, the digital filter is a Fourier filter, wherein only the low frequency component in an image is obtained. In an embodiment, the filter is a Fourier filter which is applied to a synthetic image obtained as a difference between the images formed by positive and negative orders. In an embodiment, an alignment step is performed between the images obtained from negative and positive orders, before the asymmetry image is obtained as a difference between the image formed by negative and positive orders. The state of the art dark field metrology methods may be further applied to the asymmetry image obtained after the digital filtering.

Figure 3:
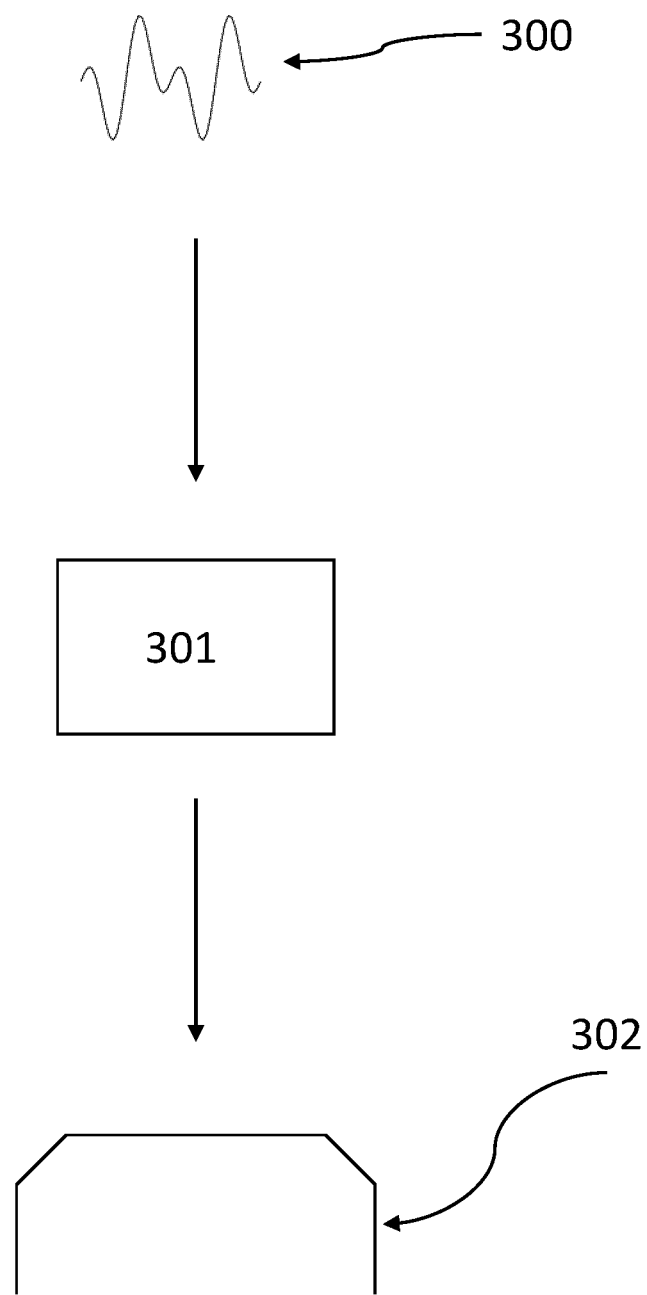
FIG. 3 depicts processing of an image 300 according to aspects of the disclosure.

In an embodiment, the method comprises the steps as depicted in FIG. 3. Element 300 is an image obtained as described in FIG. 1. Element 300 may be an asymmetry image, obtained after an alignment step between positive and negative orders formed images and further subtraction of the aligned images. Step 301 depicts the filtering step which is applied to element 300. Element 302 is sketched representation of the resulting image. Element 302 is an ideal representation of the obtained signal, as in practical application one expects that the sharp corners may be rounded, and that possible nuisance signal is still present in the resulting filtered image.

Figure 2:
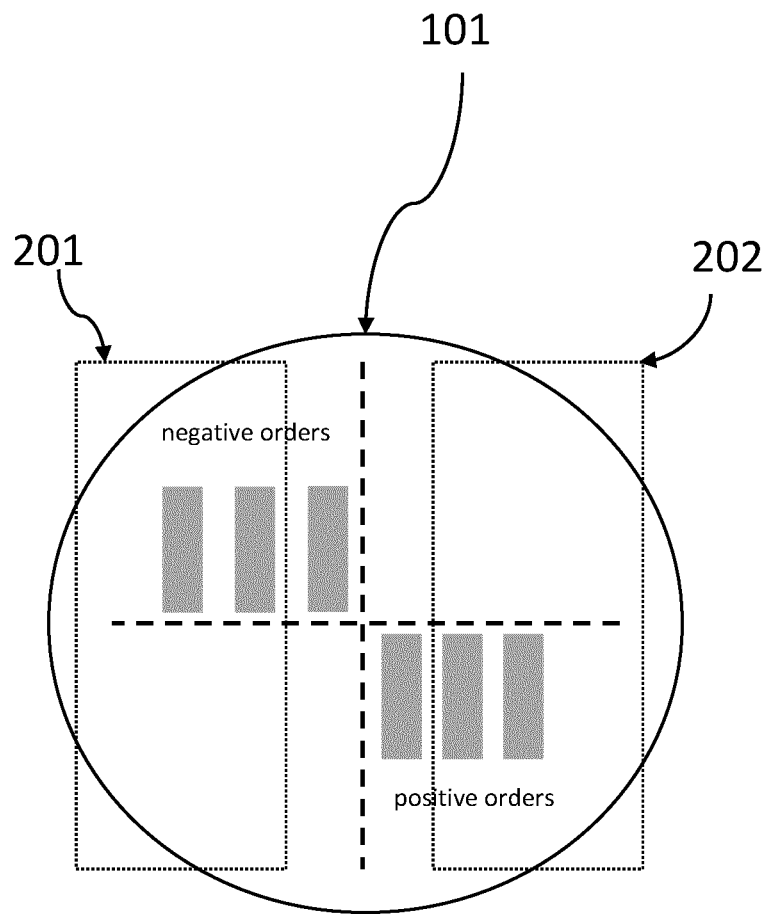
FIG. 2 depicts an aperture elements 201 and 202 according to aspects of the disclosure.

In a further embodiment, the filtering of high diffraction orders is obtained by placing an aperture in the detection branch of a metrology apparatus. As the ration between the wavelength of light and the pitch of the gratings is known, and having further knowledge of the NA of the system, an aperture may be designed with a light transmitting portion allowing only single diffraction orders. In an embodiment, the diffraction orders are +1 and −1 diffraction orders. In another embodiment, the diffraction orders are +2 and −2 diffraction orders. Further combination of single order may be further imagined, depending on the type of metrology process and metrology applications. FIG. 2 depicts such aperture in elements 201 and 202.

While much of the discussion has focused on target structures as metrology targets specifically designed and formed for the purposes of measurement, in other embodiments, the target may be a functional part of devices formed on the substrate. Many devices have regular, periodic structures akin to a grating. The term "target", "grating" or "periodic structure" of a target as used herein does not require that the applicable structure has been provided specifically for the measurement being performed.

In an embodiment, the target may be realized using a patterning device (such as a reticle or mask) designed to produce the target on a substrate (e.g., create the pattern image for projection onto a resist layer, which patterned resist layer is used to form the target using subsequent processing steps such as deposition, etching, etc.)

In association with the physical structures of the targets as realized on substrates and patterning devices (such as a reticle or mask), an embodiment may include a computer program containing one or more sequences of machine-readable instructions and/or functional data describing the target design, describing a method of producing a target on a substrate, describing a method of measuring a target on a substrate and/or describing a method of analyzing a measurement to obtain information about a patterning process (e.g., a lithographic process, an etching process, etc.). This computer program may be executed for example within a processing apparatus of a lithographic apparatus or lithocell or a metrology or inspection apparatus or on a stand-alone computer. There may also be provided a data storage medium (e.g., semiconductor memory, magnetic or optical disk) having such a computer program stored therein. Where an existing metrology or inspection apparatus is already in production and/or in use, an embodiment can be implemented by the provision of an updated computer program product for causing a processor to perform one or more of the methods described herein. The program may optionally be arranged to control the apparatus and the like to perform a method as described herein. The program can update the lithographic and/or metrology recipe for measurement of substrates. The program may be arranged to control (directly or indirectly) the lithographic apparatus for the patterning and processing of substrates.

An embodiment of the invention may take the form of a computer program containing one or more sequences of machine-readable instructions describing a method as disclosed herein, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

One or more aspects disclosed herein may be implemented in a control system. Any control system described herein may each or in combination be operable when the one or more computer programs are read by one or more computer processors located within at least one component of an apparatus. The control systems may each or in combination have any suitable configuration for receiving, processing, and sending signals. One or more processors are configured to communicate with the at least one of the control systems. For example, each control system may include one or more processors for executing the computer programs that include machine-readable instructions for the methods described above. The control systems may include data storage medium for storing such computer programs, and/or hardware to receive such medium. So the control system(s) may operate according the machine readable instructions of one or more computer programs.

Although specific reference may have been made above to the use of embodiments in the context of optical lithography, it will be appreciated that embodiments of the invention may be used in other applications. For example, embodiments may be with imprint lithography. In imprint lithography, a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured. Further, the embodiments here can be used with any process that creates a structure and so could be used with, e.g., other material removal processes or with an additive process.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

Unless specifically stated otherwise, as apparent from the discussion, it is appreciated that throughout this specification discussions utilizing terms such as "processing," "computing," "calculating," "determining" or the like can refer to actions or processes of a specific apparatus, such as a special purpose computer or a similar special purpose electronic processing/computing device.

It should be understood that the description and the drawings are not intended to limit the invention to the particular form disclosed, but to the contrary, the intention is to cover all modifications, equivalents, and alternatives falling within the spirit and scope of the present invention as defined by the appended claims.

Modifications and alternative embodiments of various aspects of the invention will be apparent to those skilled in the art in view of this description. Accordingly, this description and the drawings are to be construed as illustrative only and are for the purpose of teaching those skilled in the art the general manner of carrying out the invention. It is to be understood that the forms of the invention shown and described herein are to be taken as examples of embodiments. Elements and materials may be substituted for those illustrated and described herein, parts and processes may be reversed or omitted, certain features may be utilized independently, and embodiments or features of embodiments may be combined, all as would be apparent to one skilled in the art after having the benefit of this description of the invention. Changes may be made in the elements described herein without departing from the spirit and scope of the invention as described in the following claims. Headings used herein are for organizational purposes only and are not meant to be used to limit the scope of the description.

As used throughout this application, the word "may" is used in a permissive sense (i.e., meaning having the potential to), rather than the mandatory sense (i.e., meaning must). The words "include", "including", and "includes" and the like mean including, but not limited to. As used throughout this application, the singular forms "a," "an," and "the" include plural referents unless the content explicitly indicates otherwise. Thus, for example, reference to "an" element or "a" element includes a combination of two or more elements, notwithstanding use of other terms and phrases for one or more elements, such as "one or more." The term "or" is, unless indicated otherwise, non-exclusive, i.e., encompassing both "and" and "or." Terms describing conditional relationships, e.g., "in response to X, Y," "upon X, Y,", "if X, Y," "when X, Y," and the like, encompass causal relationships in which the antecedent is a necessary causal condition, the antecedent is a sufficient causal condition, or the antecedent is a contributory causal condition of the consequent, e.g., "state X occurs upon condition Y obtaining" is generic to "X occurs solely upon Y" and "X occurs upon Y and Z." Such conditional relationships are not limited to consequences that instantly follow the antecedent obtaining, as some consequences may be delayed, and in conditional statements, antecedents are connected to their consequents, e.g., the antecedent is relevant to the likelihood of the consequent occurring. Further, unless otherwise indicated, statements that one value or action is "based on" another condition or value encompass both instances in which the condition or value is the sole factor and instances in which the condition or value is one factor among a plurality of factors. Unless otherwise indicated, statements that "each" instance of some collection have some property should not be read to exclude cases where some otherwise identical or similar members of a larger collection do not have the property, i.e., each does not necessarily mean each and every.

To the extent certain U.S. patents, U.S. patent applications, or other materials (e.g., articles) have been incorporated by reference, the text of such U.S. patents, U.S. patent applications, and other materials is only incorporated by reference to the extent that no conflict exists between such material and the statements and drawings set forth herein. In the event of such conflict, any such conflicting text in such incorporated by reference U.S. patents, U.S. patent applications, and other materials is specifically not incorporated by reference herein.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The descriptions above are intended to be illustrative, not limiting. Thus, it will be apparent to one skilled in the art that modifications may be made to the disclosure as described without departing from the scope of the claims set out below and the breadth and scope of the present invention should not be limited by any of the above-described exemplary embodiments, but should be defined only in accordance with the following claims and their equivalents.

The invention claimed is:

1. A method for filtering high diffraction orders from an image, the method comprising:
    directing radiation onto a substrate having a target with a pitch dimension larger than a wavelength of the radiation, wherein the target is configured to diffract the radiation;
    obtaining an image of the diffracted radiation in an image plane of a detection branch of a metrology apparatus, wherein the image of the diffracted radiation contains a complex interference pattern of multiple non-zero diffraction orders and does not contain an image of zero-order diffracted radiation,
    wherein contributions of the multiple non-zero diffraction orders in the complex interference pattern are not distinguishable from each other; and
    filtering the image to remove contributions due to complex interference patterns of multiple non-zero diffraction orders.

2. The method of claim 1, wherein:
    the filtering step comprises a digital filtering.

3. The method of claim 1, wherein the obtaining the image comprises receiving the image in the image plane where a sensor is disposed.

4. The method of claim 2, wherein the filtering comprises using a Fourier filter to obtain low frequency components of the image.

5. The method of claim 4, wherein the Fourier filter is applied to a synthetic image obtained as a difference between images formed by positive and negative diffraction orders.

6. The method of claim 4, wherein an alignment step is performed between images obtained from negative and positive diffraction orders, and before an asymmetry image is obtained as a difference between an image formed by the negative and positive diffraction orders.

7. The method of claim 1, further comprising disposing an aperture in the detection branch of the metrology apparatus, thereby causing the filtering of at least two diffraction orders.

8. A metrology apparatus comprising:
    a radiation source configured to direct radiation onto a substrate having a target with a pitch dimension larger than a wavelength of the radiation, wherein the target is configured to diffract the radiation; and
    an aperture positioned in a detection branch of the metrology apparatus, wherein the aperture comprises an element with a radiation transmissive portion and wherein the radiation transmissive portion is configured to remove contributions of the diffracted radiation due to complex interference patterns of multiple non-zero diffraction orders and pass at least a single order of the diffracted radiation.

9. The metrology apparatus of claim 8, further comprising a sensor disposed in an image plane and configured to capture an image of at least +1 and −1 orders of the diffracted radiation.

10. The metrology apparatus of claim 9, further comprising a filter configured to obtain low frequency components of the image.

11. The metrology apparatus of claim 10, wherein the filter is configured to use a Fourier filter configured to apply a synthetic image obtained as a difference between images formed by the at least +1 and −1 orders of the diffracted radiation.

12. A non-transitory computer readable medium program comprising processor readable instructions which, when run on a suitable processor controlled apparatus, cause the processor controlled apparatus to perform the method comprising:
    receiving an image formed in a metrology apparatus, wherein the image comprises radiation diffracted off a substrate having a target with a pitch dimension larger than a wavelength of the radiation, wherein the image contains a complex interference pattern of multiple non-zero diffraction orders and does not contain an image of zero-order diffracted radiation,
    wherein contributions of the multiple non-zero diffraction orders in the complex interference pattern are not distinguishable from each other; and
    processing the image, wherein the processing comprises filtering the image to remove contributions due to complex interference patterns of multiple non-zero diffraction orders.

13. The non-transitory computer readable medium program of claim 12, wherein the filtering step comprises digital filtering.

14. The non-transitory computer readable medium program of claim 12, wherein obtaining the image comprises receiving the image in an image plane where a sensor is disposed.

15. The non-transitory computer readable medium program of claim 13, wherein the filtering step comprises using a Fourier filter to obtain low frequency components of the image.

16. The non-transitory computer readable medium program of claim 15, wherein the Fourier filter is applied to a synthetic image obtained as a difference between images formed by positive and negative diffraction orders.

17. The non-transitory computer readable medium program of claim 15, wherein an alignment step is performed between images obtained from negative and positive diffraction orders, and before an asymmetry image is obtained as a difference between an image formed by the negative and positive diffraction orders.

18. The non-transitory computer readable medium program of claim 12, further comprising disposing an aperture in a detection branch of the metrology apparatus, thereby causing filtering of high diffraction orders of at least two diffraction orders.

* * * * *